(12) United States Patent
Chen

(10) Patent No.: US 8,461,890 B1
(45) Date of Patent: Jun. 11, 2013

(54) PHASE AND/OR FREQUENCY DETECTOR, PHASE-LOCKED LOOP AND OPERATION METHOD FOR THE PHASE-LOCKED LOOP

(75) Inventor: Chien-Liang Chen, Taoyuan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/186,557

(22) Filed: Jul. 20, 2011

(51) Int. Cl.
*H03L 7/06* (2006.01)

(52) U.S. Cl.
USPC .......................................... 327/158; 327/149

(58) Field of Classification Search
USPC ................................. 327/149, 158
See application file for complete search history.

(56) References Cited

U.S. PATENT DOCUMENTS

| | | | |
|---|---|---|---|
| 3,693,099 A | 9/1972 | Oberst | |
| 3,697,690 A | 10/1972 | Aaron | |
| 4,333,055 A | 6/1982 | Crackel | |
| 5,508,660 A | 4/1996 | Gersbach et al. | |
| 5,920,207 A | 7/1999 | Suresh | |
| 5,977,801 A | 11/1999 | Boerstler | |
| 6,140,853 A | 10/2000 | Lo | |
| 6,236,275 B1* | 5/2001 | Dent | 331/1 A |
| 6,259,278 B1 | 7/2001 | Huang | |
| 6,624,707 B1* | 9/2003 | Davis et al. | 331/25 |
| 6,771,096 B1 | 8/2004 | Meyers et al. | |
| 6,822,484 B1 | 11/2004 | Boerstler | |
| 7,042,970 B1* | 5/2006 | Keaveney et al. | 375/371 |
| 7,042,972 B2* | 5/2006 | Fahim | 375/376 |
| 7,092,475 B1* | 8/2006 | Huard | 375/375 |
| 7,375,557 B2 | 5/2008 | Cho | |
| 7,592,847 B2* | 9/2009 | Liu et al. | 327/162 |
| 7,656,214 B1 | 2/2010 | Han | |
| 7,876,871 B2* | 1/2011 | Zhang | 375/374 |
| 2006/0076981 A1 | 4/2006 | Sanduleanu | |
| 2007/0268050 A1 | 11/2007 | Liu et al. | |
| 2008/0061838 A1 | 3/2008 | Wang et al. | |
| 2008/0129352 A1* | 6/2008 | Zhang | 327/157 |
| 2008/0231324 A1* | 9/2008 | Liu et al. | 327/12 |
| 2010/0225368 A1* | 9/2010 | Lu et al. | 327/157 |
| 2011/0095803 A1* | 4/2011 | Meijer et al. | 327/291 |

FOREIGN PATENT DOCUMENTS

| | | |
|---|---|---|
| CN | 1960184 | 5/2007 |
| EP | 0704977 | 4/1996 |
| JP | 58092963 | 6/1983 |
| KR | 20040081530 | 9/2004 |
| KR | 20060011328 | 2/2006 |
| TW | 510083 | 11/2002 |
| WO | 2010059032 | 5/2010 |

* cited by examiner

*Primary Examiner* — Lincoln Donovan
*Assistant Examiner* — Adam Houston
(74) *Attorney, Agent, or Firm* — Ding Yu Tan

(57) ABSTRACT

The present invention provides a phase and/or frequency detector, a PLL and an operation method for the PLL. The phase and/or frequency detector comprises two flip-flops, a logic gate, a control circuit and a delay circuit. The clock-input terminals of the two flip-flops receive a reference signal and a frequency-divided signal respectively. The logic gate receives signals outputted from the data-output terminals of the two flip-flops. The control circuit is configured for generating a corresponding delay control signal according to an oscillating frequency of an oscillating signal outputted from the PLL. The delay circuit is configured for altering a prolonged period according to the delay control signal to output a reset signal to the reset terminals of the two flip-flops.

14 Claims, 9 Drawing Sheets

PHASE AND/OR FREQUENCY DETECTOR, PHASE-LOCKED LOOP AND OPERATION METHOD FOR THE PHASE-LOCKED LOOP

FIELD OF THE INVENTION

The present invention relates to the technology of the phase-locked loop (PLL), and more particularly to a phase and/or frequency detector which can be used to solve the jittering problem of the output signal of the conventional phase-locked loop, a phase-locked loop adopting the above phase and/or frequency detector, and an operation method for the above phase-locked loop.

BACKGROUND OF THE INVENTION

Phase-locked loop (PLL) is an auto-controlling circuit system, which is able to track the frequency and the phase of an input signal. The phase-locked loop tracks and locks the phases and the frequencies of an output signal and the input signal, so as to keep the phase and the frequency of the output signal at a predetermined value or in a predetermined range. Currently, the phase-locked loop has been widely used in computers and consumer products.

However, the phase-locked loop is prone to be interfered by noise, and this may cause the time offset problem of the output signal (i.e., the so-called jittering problem) and result in the clock error.

SUMMARY OF THE INVENTION

The present invention relates to a phase and/or frequency detector, which can be used to solve the jittering problem of the output signal of the conventional phase-locked loop.

The present invention also relates to a phase-locked loop adopting the above phase and/or frequency detector.

The present invention further relates to an operation method for the above phase-locked loop.

The present invention provides a phase and/or frequency detector, which comprises a first flip-flop, a second flip-flop, a logic gate, a control circuit and a delay circuit. The first flip-flop has a first data-input terminal, a first data-output terminal, a first clock-input terminal and a first reset terminal. The first data-input terminal is electrically coupled to a power source, and the first clock-input terminal is configured for receiving a reference signal with a reference frequency. The second flip-flop has a second data-input terminal, a second data-output terminal, a second clock-input terminal and a second reset terminal. The second data-input terminal is electrically coupled to the power source. The second clock-input terminal is configured for receiving a frequency-divided signal, and the frequency-divided signal is generated by performing a frequency-divided operation on an oscillating signal with an oscillating frequency. The logic gate is configured for receiving signals outputted from the first data-output terminal and the second data-output terminal. The control circuit is configured for generating a delay control signal according to the oscillating frequency of the oscillating signal. The delay circuit is configured for altering a prolonged period according to the delay control signal to generate a reset signal to be outputted to the first reset terminal and the second reset terminal.

The present invention also provides a phase lock loop (PLL), which comprises a phase and/or frequency detector, a charge pump, a loop filter, a voltage-controlled oscillator (VCO) and a frequency divider. The phase and/or frequency detector comprises a first flip-flop, a second flip-flop, a logic gate, a control circuit and a delay circuit. The first flip-flop has a first data-input terminal, a first data-output terminal, a first clock-input terminal and a first reset terminal. The first data-input terminal is electrically coupled to a power source, and the first clock-input terminal is configured for receiving a reference signal with a reference frequency. The second flip-flop has a second data-input terminal, a second data-output terminal, a second clock-input terminal and a second reset terminal. The second data-input terminal is electrically coupled to the power source. The second clock-input terminal is configured for receiving a frequency-divided signal, and the frequency-divided signal is generated by performing a frequency-divided operation on an oscillating signal with an oscillating frequency. The logic gate is configured for receiving signals outputted from the first data-output terminal and the second data-output terminal. The control circuit is configured for generating a delay control signal according to the oscillating frequency of the oscillating signal. The delay circuit is configured for altering a prolonged period according to the delay control signal to generate a reset signal to be outputted to the first reset terminal and the second reset terminal. The charge pump is configured for generating an output current according to the signals outputted from the first data-output terminal and the second data-output terminal. The loop filter is configured for generating a frequency control voltage according to the output current. The voltage-controlled oscillator is configured for generating the oscillating signal and determining the oscillating frequency of the oscillating signal according to the frequency control voltage. The frequency divider is configured for performing the frequency-divided operation on the oscillating signal accordingly to a frequency-divided multiple corresponding to a frequency-divided control signal, so as to generate the frequency-divided signal.

The present invention further provides an operation method for a phase-locked loop. The phase-locked loop comprises a phase and/or frequency detector, and the phase and/or frequency detector comprises a first flip-flop, a second flip-flop, a logic gate and a delay circuit. The first flip-flop has a first data-input terminal, a first data-output terminal, a first clock-input terminal and a first reset terminal. The first data-input terminal is electrically coupled to a power source, and the first clock-input terminal is configured for receiving a reference signal with a reference frequency. The second flip-flop has a second data-input terminal, a second data-output terminal, a second clock-input terminal and a second reset terminal. The second data-input terminal is electrically coupled to the power source. The second clock-input terminal is configured for receiving a frequency-divided signal, and the frequency-divided signal is generated by performing a frequency-divided operation on an oscillating signal with an oscillating frequency outputted from the phase-locked loop. The logic gate is configured for receiving signals outputted from the first data-output terminal and the second data-output terminal. The delay circuit is configured for prolonging a rising period of each of the pulses of a signal outputted from the logic gate, so as to generate a reset signal to be outputted to the first reset terminal and the second reset terminal. The operation method comprises the following steps: determining whether the oscillating frequency is larger than or equal to a predetermined frequency; and controlling the delay circuit to reduce the prolonged period when the oscillating frequency is larger than or equal to the predetermined frequency.

In an exemplary embodiment of the phase and/or frequency detector and an exemplary embodiment of the phase-locked loop of the present invention, the delay control signal controls the delay circuit to increase the prolonged period when the oscillating frequency is less than a predetermined frequency, and the delay control signal controls the delay circuit to reduce the prolonged period when the oscillating frequency is larger than or equal to the predetermined frequency.

In an exemplary embodiment of the phase and/or frequency detector and an exemplary embodiment of the phase-locked loop of the present invention, the control circuit comprises a frequency detector and a control unit. The frequency detector is configured for receiving the oscillating signal and detecting the oscillating frequency of the oscillating signal, so as to generate a detecting result accordingly. The control unit is configured for generating the corresponding delay control signal according to the detecting result.

In an exemplary embodiment of the phase and/or frequency detector and an exemplary embodiment of the phase-locked loop of the present invention, the frequency detector comprises a counter. The counter is configured for counting an enable period of each of the pulses of the oscillating signal and regarding a counting value as the detecting result.

In an exemplary embodiment of the phase and/or frequency detector and an exemplary embodiment of the phase-locked loop of the present invention, the control circuit comprises a voltage detector and a control unit. The voltage detector is configured for detecting the voltage value of a frequency control voltage received by a voltage-controlled oscillator (VCO) and generating a detecting result accordingly, and the voltage-controlled oscillator is configured for generating the oscillating signal. The control unit is configured for generating the corresponding delay control signal according to the detecting result.

In an exemplary embodiment of the phase and/or frequency detector and an exemplary embodiment of the phase-locked loop of the present invention, the delay control signal is a digital control signal with a plurality of bits, and the delay circuit comprises a plurality of buffers and a plurality of MOS transistors. The buffers are electrically coupled in series. Each of the MOS transistors is electrically coupled between an input terminal and an output terminal of a corresponding one of the buffers, and each of the bits of the digital control signal is configured for determining whether a corresponding one of the MOS transistors is turned on.

In an exemplary embodiment of the operation method for the phase-locked loop of the present invention, the operation method further comprises the following step: controlling the delay circuit to increase the prolonged period when the oscillating frequency is less than the predetermined frequency.

The present invention adds the delay circuit and the control circuit into the phase and/or frequency detector. Thus, the present invention can employ the delay circuit to prolong the rising period of each of the pulses of the signal outputted from the logic gate, so as to further prolong the rising period of each of the pulses of the frequency-increasing control signal (i.e., the signal outputted from the first flip-flop) and the rising period of each of the pulses of the frequency-reducing control signal (i.e., the signal outputted from the second flip-flop) outputted from the phase and/or frequency detector. Therefore, the problem of the dead zone of the conventional phase-locked loop can be solved, and the jittering problem of the output signal of the phase-locked loop can also be solved. In addition, the present invention can further employ the control circuit to determine whether the oscillating frequency outputted from the phase-locked loop is larger than or equal to a predetermined frequency and to dynamically control the power consumption of the phase-locked loop. When the oscillating frequency is larger than or equal to the predetermined frequency, the control circuit controls the delay circuit to reduce the prolonged period for reducing the power consumption of the phase-locked loop operating in high frequency. When the oscillating frequency is less than the predetermined frequency, the control circuit controls the delay circuit to increase the prolonged period.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
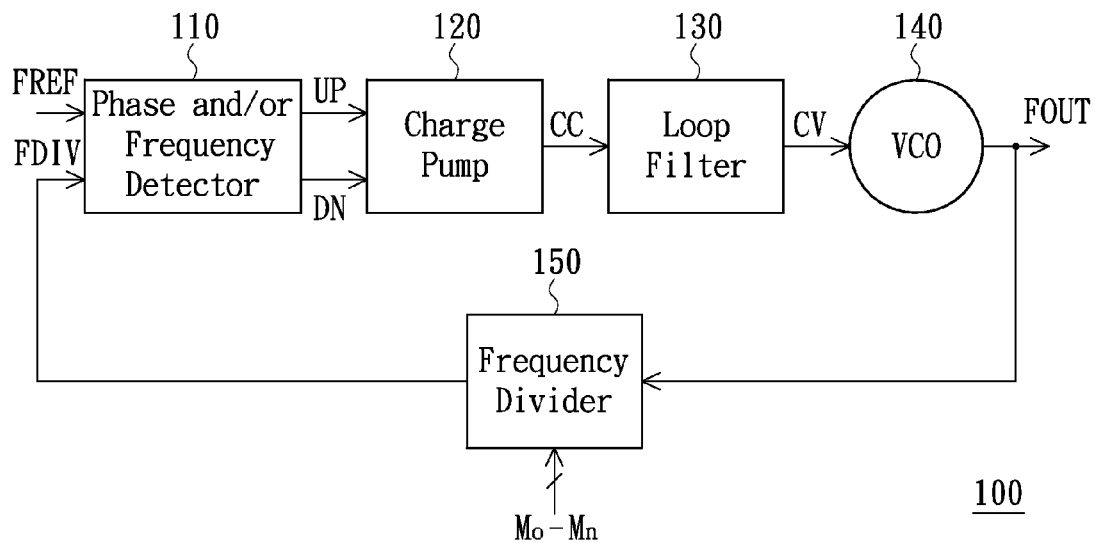
FIG. 1 is a schematic view of a phase-locked loop.

FIG. 1 is a block view of a phase-locked loop (PLL). As shown in FIG. 1, the phase-locked loop 100 comprises a phase and/or frequency detector 110, a charge pump 120, a loop filter 130, a voltage-controlled oscillator (VCO) 140 and a frequency divider 150. The phase and/or frequency detector 110 is configured for receiving a frequency-divided signal FDIV and a reference signal FREF with a reference frequency, and the phase and/or frequency detector 110 determines whether to output a frequency-increasing control signal UP and a frequency-reducing control signal DN according to the phase difference between the frequency-divided signal FDIV and the reference signal FREF. The charge pump 120 is configured for generating an output current CC according to the frequency-increasing control signal UP and the frequency-reducing control signal DN. The loop filter 130 is configured for generating a frequency control voltage CV according to the output current CC. The voltage-controlled oscillator 140 is configured for generating an oscillating signal FOUT and determining the oscillating frequency of the oscillating signal FOUT according to the frequency control voltage CV. The frequency divider 150 is configured for performing a frequency-divided operation on the oscillating signal FOUT accordingly to a frequency-divided multiple corresponding to a digital frequency-divided control signal (having bits of Mo—Mn), so as to generate the frequency-divided signal FDIV.

Figure 2:
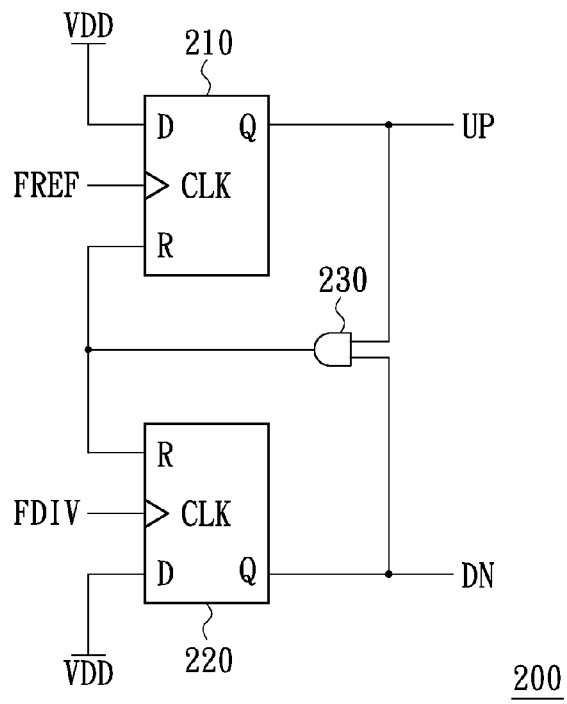
FIG. 2 is a schematic view of a kind of the phase and/or frequency detectors.

FIG. 2 is a schematic view of a kind of the phase and/or frequency detectors. As shown in FIG. 2, the phase and/or frequency detector 200 comprises a flip-flop 210, a flip-flop 220 and a logic gate 230. In this embodiment, each of the flip-flops 210 and 220 is a D-type flip-flop which is triggered by rising edges, and each of the flip-flops 210 and 220 comprises a data-input terminal D, a data-output terminal Q, a clock-input terminal CLK and a reset terminal R. The data-input terminals D of the two flip-flops 210 and 220 are both electrically coupled to a power voltage VDD. In addition, the clock-input terminal CLK of the flip-flop 210 is configured for receiving the reference signal FREF, and the data-output terminal Q thereof is configured for outputting the frequency-increasing control signal UP. The clock-input terminal CLK of the flip-flop 220 is configured for receiving the frequency-divided signal FDIV, and the data-output terminal Q thereof is configured for outputting the frequency-reducing control signal DN. In addition, the logic gate 230 of the exemplary embodiment is an AND gate.

Figure 3:
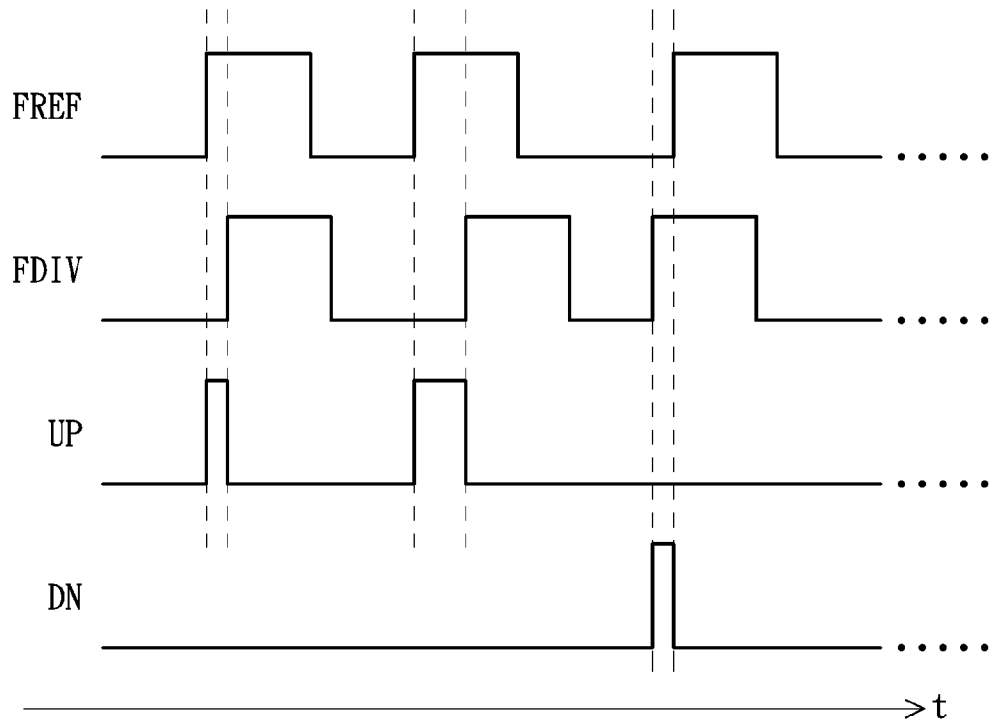
FIG. 3 is a schematic view for showing the operation principle of the phase and/or frequency detector as shown in FIG. 2.

FIG. 3 is a schematic view for showing an operation principle of the phase and/or frequency detector as shown in FIG. 2. The labels in FIG. 3 which are the same as those in FIG. 2 represent the same signals, and a label of t represents time. Referring to FIGS. 2 and 3, when the frequency-divided signal FDIV lags the reference signal FREF, the phase and/or frequency detector 200 will output the frequency-increasing control signal UP to further control the back-end voltage-controlled oscillator to increase the oscillating frequency of the oscillating signal. On the contrary, when the frequency-divided signal FDIV leads the reference signal FREF, the phase and/or frequency detector 200 will output the frequency-reducing control signal DN to further control the back-end voltage-controlled oscillator to reduce the oscillating frequency of the oscillating signal. The phase and/or frequency detector 200 may continuously control the voltage-controlled oscillator to adjust the oscillating frequency of the oscillating signal until the reference signal FREF and the frequency-divided signal FDIV are in-phase. Thus, the oscillating frequency of the oscillating signal will be kept at a target frequency. In addition, from FIG. 3, it can be seen that the enable period of each of the pulses of the frequency-increasing control signal UP and the enable period of each of the pulses of the frequency-reducing control signal DN are determined by the phase difference between the reference signal FREF and the frequency-divided signal FDIV.

Figure 4:
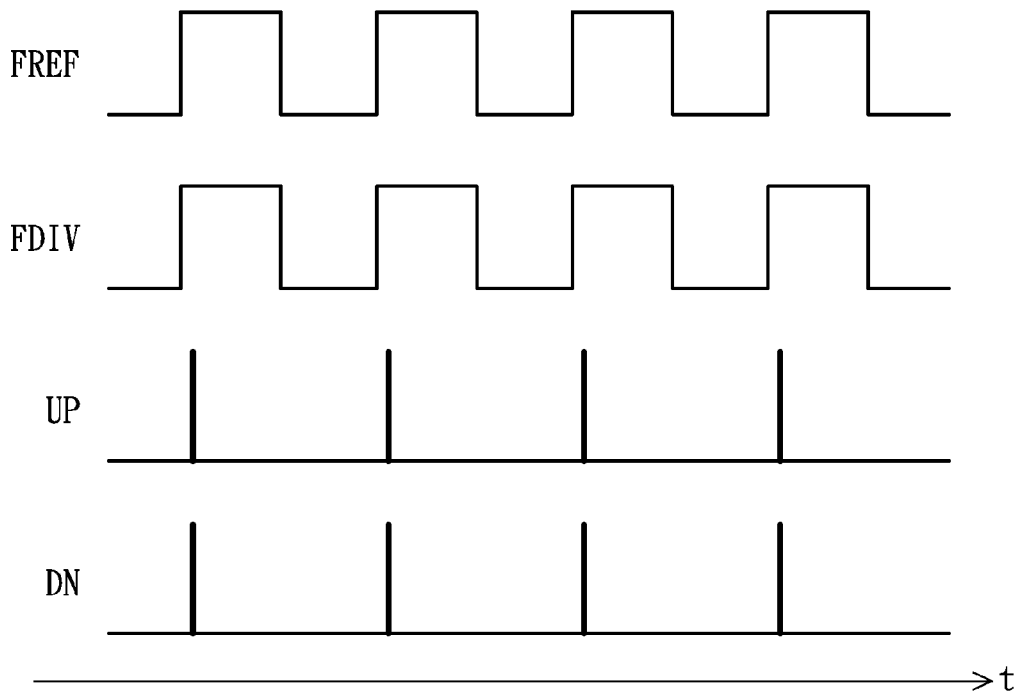
FIG. 4 is a schematic view for showing the timing sequence of the frequency-increasing control signal and the frequency-reducing control signal.

However, when the phases of the reference signal FREF and the frequency-divided signal FDIV are quite close to each other, the phase and/or frequency detector 200 will output the frequency-increasing control signal UP and the frequency-reducing control signal DN simultaneously, and the enable period of each of the pulses of the frequency-increasing control signal UP and the enable period of each of the pulses of the frequency-reducing control signal DN are very short (as shown in FIG. 4). FIG. 4 is a schematic view for showing the timing sequence of the frequency-increasing control signal and the frequency-reducing control signal. The labels in FIG. 4 which are the same as those in FIG. 2 represent the same signals, and a label of t represent time. Since the enable period of each of the pulses of the frequency-increasing control signal UP and the enable period of each of the pulses of the frequency-reducing control signal DN are very short, the back-end charge pump cannot normally operate according to the frequency-increasing control signal UP and the frequency-reducing control signal DN. This will be described by FIG. 5.

Figure 5:
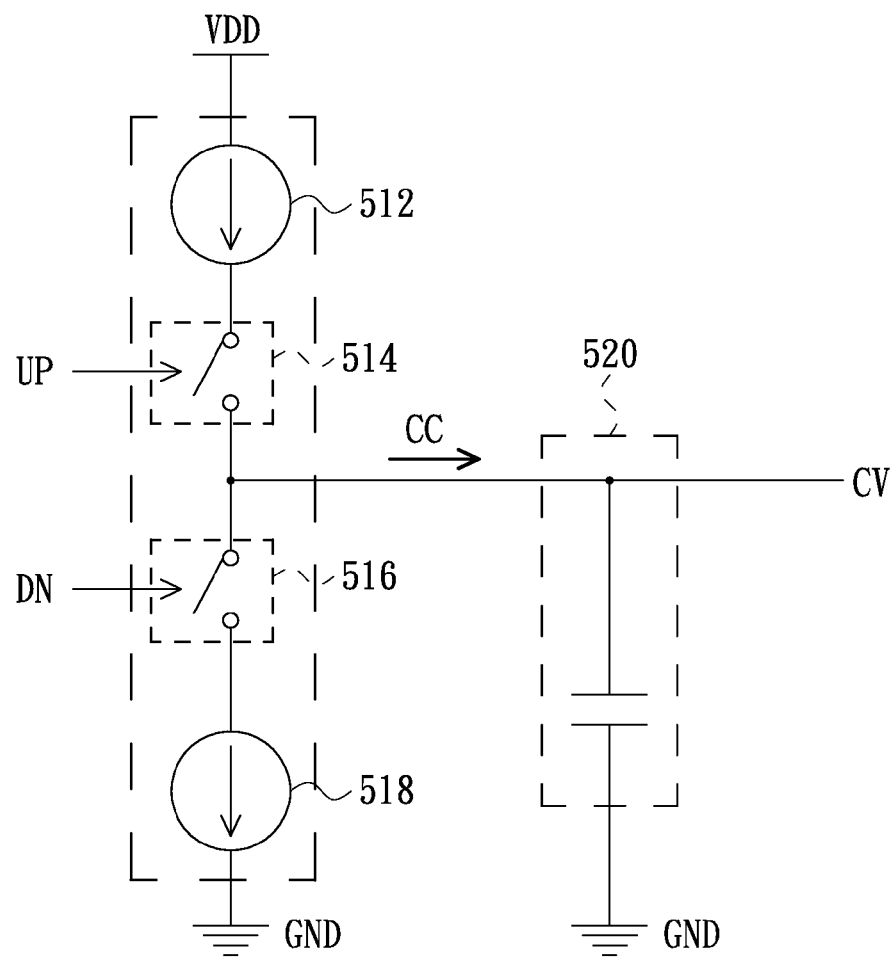
FIG. 5 is a schematic view for showing a kind of charge pumps and a kind of loop filters.

FIG. 5 is a schematic view for showing a kind of charge pumps and a kind of loop filters. As shown in FIG. 5, the charge pump 510 consists of a current source 512, a switch 514, a switch 514, a switch 516 and a current source 518. The current sources 512 and 518 are electrically coupled to the power voltage VDD and the ground voltage GND respectively. The switches 514 and 516 are controlled by the frequency-increasing control signal UP and the frequency-reducing control signal DN respectively so as to determine whether to be turned on. The loop filter 520 may be a capacitor. The switches 514 and 516 may be metal-oxide semiconductor filed-effect transistors (MOSFETs). Thus, the switches 514 and 516 cannot timely respond to the frequency-increasing control signal UP and the frequency-reducing control signal DN and will be in off-state since the enable period of each of the pulses of the frequency-increasing control signal UP and the enable period of each of the pulses of the frequency-reducing control signal DN are very short. That is, at this time, the charge pump 510 does not operate, and a dead zone in operation occurs. This will be described by FIG. 6.

Figure 6:
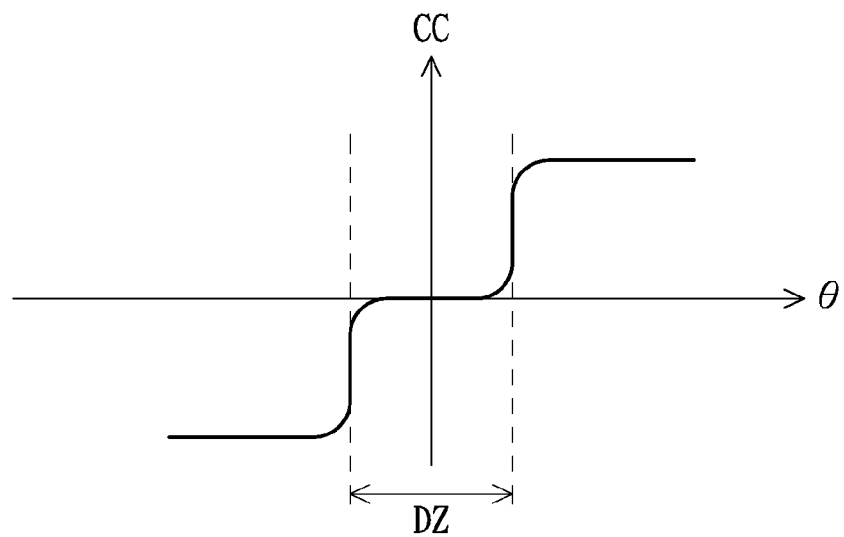
FIG. 6 is a schematic view for showing a corresponding relation between the output current of the charge pump and the phase difference between the reference signal and the frequency-divided signal.

FIG. 6 is a schematic view for showing a corresponding relation between the output current of the charge pump and the phase difference between the reference signal and the frequency-divided signal. In FIG. 6, a label of CC represents the output current of the charge pump 510, a label of θ represents the phase difference between the reference signal FREF and the frequency-divided signal FDIV, and a label of DZ represents the dead zone. The right side of the vertical axis in FIG. 6 shows the condition that the frequency-divided signal FDIV lags the reference signal FREF, and the left side of the vertical axis in FIG. 6 shows the condition that the frequency-divided signal FDIV leads the reference signal FREF. The dead zone DZ shows the condition that the enable period of one of the pluses of the frequency-increasing control signal UP and the enable period of a corresponding one of the pulses of the frequency-reducing control signal DN are very short when the phase difference between the reference signal FREF and frequency-divided signal FDIV is very small. From FIG. 6, it can be seen that the charge pump 510 does not operate when the enable period of one of the pulses of the frequency-increasing control signal UP and the enable period of a corresponding one of the pulses of the frequency-reducing control signal DN are very short. Thus, the output current CC is approximately zero.

Figure 7:
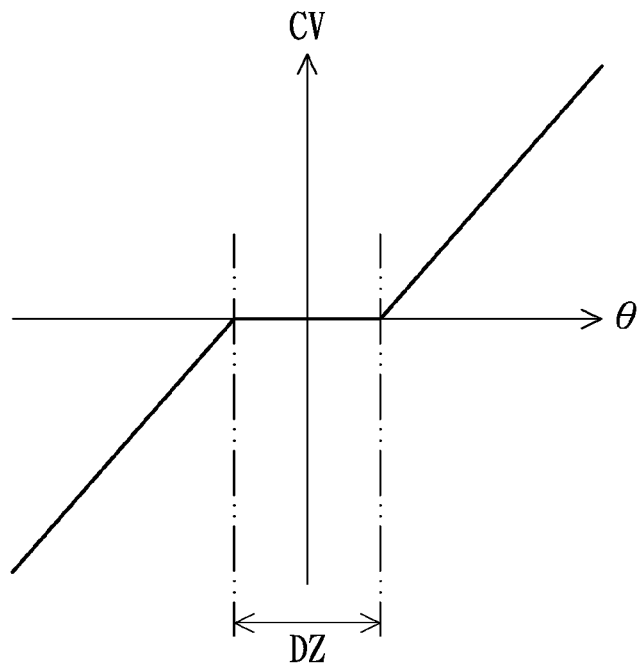
FIG. 7 is a schematic view for showing a corresponding relation between the frequency control voltage and the phase difference between the reference signal and the frequency-divided signal.

FIG. 7 is a schematic view for showing a corresponding relation between the frequency control voltage and the phase difference between the reference signal and the frequency-divided signal. In FIG. 7, a label of CV represents the frequency control voltage generated by the loop filter 520, a label of θ represents the phase difference between the reference signal FREF and the frequency-divided signal FDIV, and a label of DZ represents the dead zone. The right side of the vertical axis in FIG. 7 shows the condition that the frequency-divided signal FDIV lags the reference signal FREF, and the left side of the vertical axis in FIG. 7 shows the condition that the frequency-divided signal FDIV leads the reference signal FREF. The dead zone DZ shows the condition that the enable period of one of the pulses of the frequency-increasing control signal UP and the enable period of a corresponding one of the pulses of the frequency-reducing control signal DN are very short when the phase difference between the reference signal FREF and the frequency-divided signal FDIV is very small. From FIG. 7, it can be seen that the charge pump 510 does not operate and the output current is approximately zero when the enable period of one of the pulses of the frequency-increasing control signal UP and the enable period of a corresponding one of the pulses of the frequency-reducing control signal DN are very short, so that the frequency control voltage CV generated by the loop filter 520 is also approximately zero.

Figure 8:
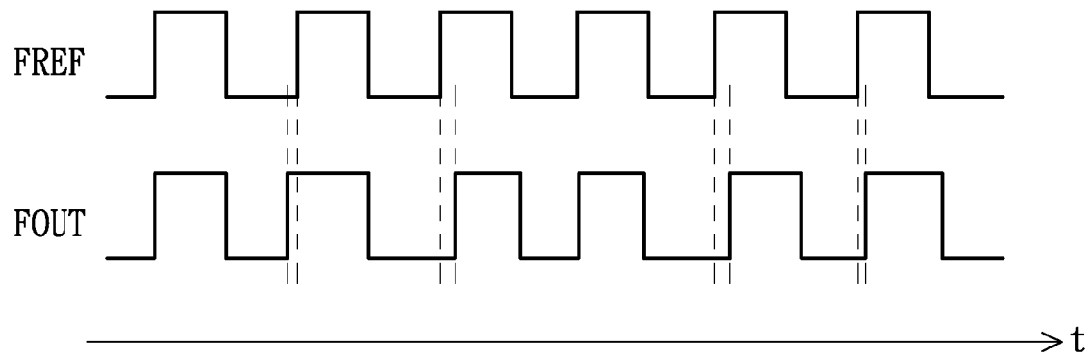
FIG. 8 is a schematic view for showing the condition that the oscillating signal has little difference compared with the reference signal.

Since the charge pump 510 cannot perform the charging or discharging operation on the loop filter 520 when the enable period of one of the pulses of the frequency-increasing control signal UP and the enable period of a corresponding one of the pulses of the frequency-reducing control signal DN are very short, the back-end voltage-controlled oscillator will output an oscillating signal with little error compared with the reference signal FREF (as shown in FIG. 8). FIG. 8 is a schematic view for showing the condition that the oscillating signal has little error compared with the reference signal. In FIG. 8, the label of FREF represents the reference signal, the label of FOUT represents the oscillating signal generated by the voltage-controlled oscillator, and the label of t represents time. From FIG. 8, it can be seen that the time offset problem (i.e., the jittering problem) occurs on the oscillating signal FOUT.

Figure 9:
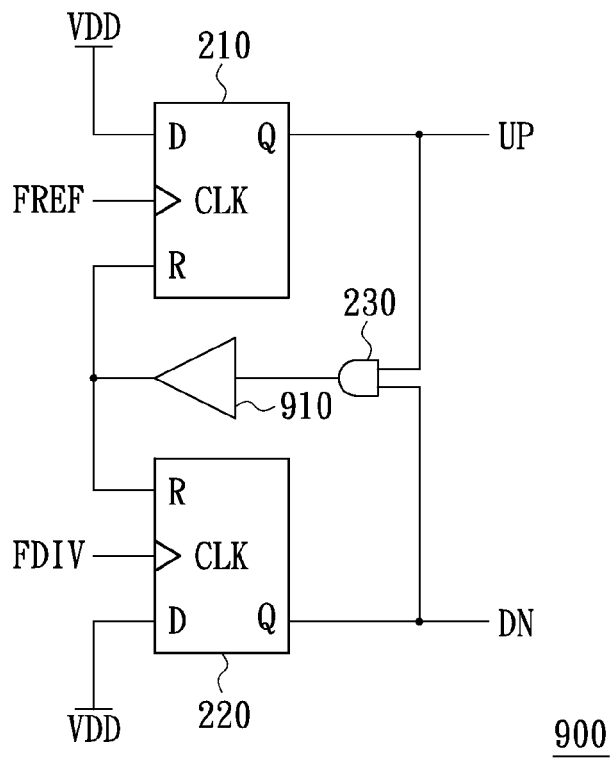
FIG. 9 is a schematic view of a phase and/or frequency detector.
Figure 10:
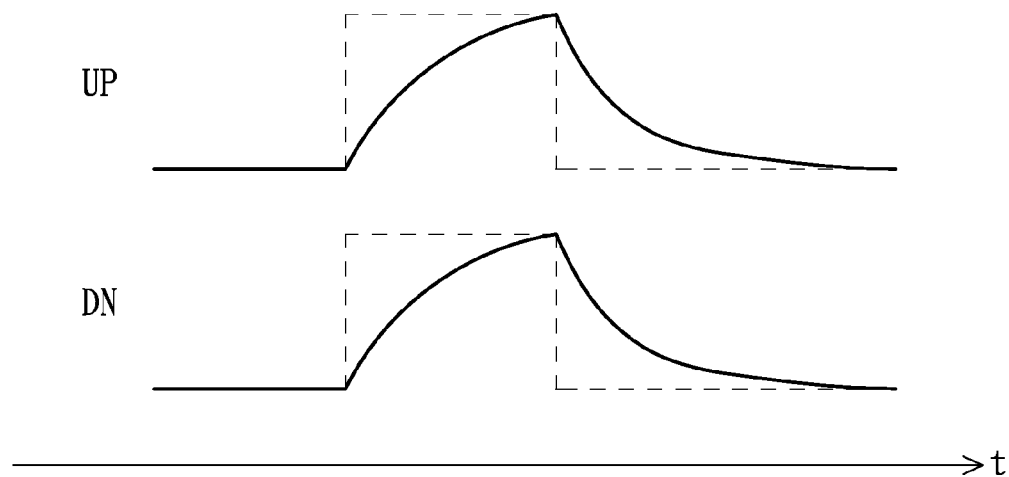
FIG. 10 is a schematic view for showing the frequency-increasing control signal and the frequency-reducing control signal, of which the rising periods have been delayed.

To solve the problem of the dead zone of the phase-locked loop, a phase and/or frequency detector as shown in FIG. 9 can be adopted in a phase-locked loop. FIG. 9 is a schematic view of a phase and/or frequency detector. The labels in FIG. 9 which are the same as those in FIG. 2 represent the same objects or signals. The phase and/or frequency detector 900 as shown in FIG. 9 is similar to the phase and/or frequency detector 200 as shown in FIG. 2 except that the phase and/or frequency detector 900 further comprises a delay circuit 910. The delay circuit 910 is configured for prolonging a rising period of each of the pulses of the signal outputted by the logic gate 230, so as to generate a reset signal to be outputted to the reset terminals R of the flip-flops 210 and 220 (which may both be D-type flip-flops). Therefore, when the phase difference between the reference signal FREF and the frequency-divided signal FDIV is very small, the rising period of each of the pulses of the frequency-increasing control signal UP and the rising period of each of the pulses of the frequency-reducing control signal DN outputted by the phase and/or frequency detector 900 are both prolonged (as shown in FIG. 10). FIG. 10 is a schematic view for showing the frequency-increasing control signal and the frequency-reducing control signal, of which the rising periods have been prolonged. The labels in FIG. 10 which are the same as those in FIG. 9 represent the same signals, and the label of t represents time.

Since the rising period of each of the pulses of the frequency-increasing control signal UP and the rising period of each of the pulses of the frequency-reducing control signal DN are both prolonged, the switches in the charge pump have enough time to respond to the frequency-increasing control signal UP and the frequency-reducing control signal DN, so that they are in on-state. Therefore, at this time, the charge pump can perform the charging or discharging operation on the loop filter according to the frequency-increasing control signal UP and the frequency-reducing control signal DN. Thus, the problem of dead zone is solved.

However, since the rising period of each of the pulses of the frequency-increasing control signal UP and the rising period of each of the pulses of the frequency-reducing control signal DN are both prolonged, the charge pump performs the charging and discharging operation on the loop filter simultaneously. Therefore, if the phase-locked loop operates in high frequency, the power consumption of the phase-locked loop will be very large. In addition, referring to FIG. 5 again, since the two switches in the charge pump 510 are generally implemented by an N-type MOS transistor and a P-type MOS transistor respectively, and the turn-on current of the N-type MOS transistor is not equal to that of the P-type MOS, the charge current will mismatch the discharge current when the rising period of each of the pulses of the frequency-increasing control signal UP and the rising period of each of the pulses of the frequency-reducing control signal DN are both prolonged. Thus, the frequency control voltage CV generated by the loop filter 520 will be disturbed accordingly, resulting in the problem of jitter of the oscillating signal outputted from the phase-locked loop. To solve the above problem, a phase and/or frequency detector as shown in FIG. 11 can be adopted in a phase-locked loop.

Figure 11:
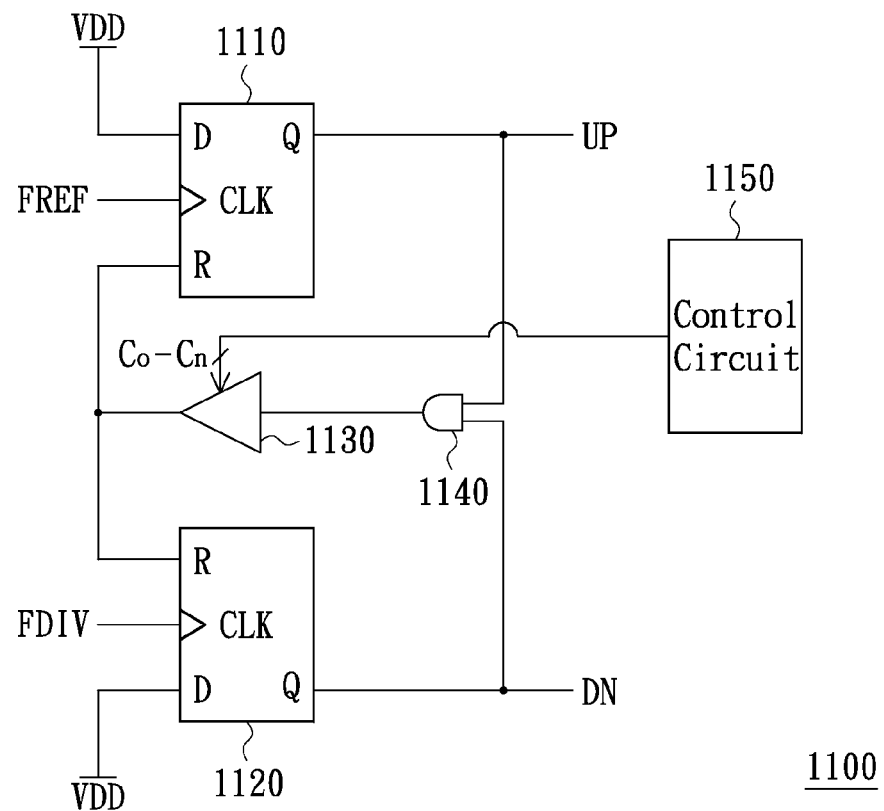
FIG. 11 is a schematic view of a phase and/or frequency detector in accordance with an exemplary embodiment of the present invention.

FIG. 11 is a schematic view of a phase and/or frequency detector in accordance with an exemplary embodiment of the present invention. As shown in FIG. 11, the phase and/or frequency detector 1100 comprises a flip-flop 1110, a flip-flop 1120, a delay circuit 1130, a logic gate 1140 and a control circuit 1150. In the exemplary embodiment, each of the flip-flops 1110 and 1120 is a D-type flip-flop which is triggered by rising edges, and each of the flip-flops 1110 and 1120 comprises a data-input terminal D, a data-output terminal Q, a clock-input terminal CLK and a reset terminal R. The data-input terminals D of the two flip-flops 1110 and 1120 are both electrically coupled to a power voltage VDD. In addition, the clock-input terminal CLK of the flip-flop 1110 is configured for receiving a reference signal FREF come from the outside of the phase-locked loop, and the data-output terminal Q thereof is configured for outputting a frequency-increasing control signal UP. The clock-input terminal CLK of the flip-flop 1120 is configured for receiving a frequency-divided signal FDIV, and the data-output terminal Q thereof is configured for outputting a frequency-reducing control signal DN. The frequency-divided signal FDIV is generated by performing a frequency-divided operation on an oscillating signal outputted from the phase-locked loop, and the oscillating signal has an oscillating frequency.

In addition, the logic gate 1140 is configured for receiving signals outputted from the data-output terminals Q of the flip-flops 1110 and 1120, that is, the frequency-increasing control signal UP and the frequency-reducing control signal DN. In the exemplary embodiment, the logic gate 1140 may be an AND gate. The control circuit 1150 is configured for generating a delay control signal according to the oscillating frequency of the oscillating signal. In the exemplary embodiment, the delay control signal is a digital control signal with a plurality of bits of Co-Cn. However, the delay control signal in the present invention is not limited in the digital control signal, and it may also be an analog signal. The delay circuit 1130 is configured for prolonging the rising period of each of the pulses of the signal outputted from the logic gate 1140 and altering the prolonged period according to the delay control signal with the bits of Co-Cn (this will be described later), so as to generate a reset signal to be outputted to the reset terminals of the two flip-flops 1110 and 1120.

Therefore, when the oscillating frequency is less than a predetermined frequency, the delay control signal with the bits of Co-Cn controls the delay circuit 1130 to increase the prolonged period. When the oscillating frequency is larger than or equal to the predetermined frequency, the delay control signal with the bits of Co-Cn controls the delay circuit 1130 to reduce the prolonged period. Thus, the power consumption of the whole phase-locked loop can be dynamically reduced. When the phase-locked loop operates in high frequency, the phase and/or frequency detector of the present invention may reduce the prolonged period of the delay circuit 1130 to reduce the power consumption of the phase-locked loop and reduce the probability of the oscillating signal jittering.

Although the flip-flops 1110 and 1120 are two common D-type flip-flops in the exemplary embodiment as shown in FIG. 11, the present invention is not limited herein. It is understood for persons skilled in the art that the common D-type flip-flop may be further implemented by a T-type flip-flop, a J-K flip-flop or a R-S flip-flop. In addition, although the logic gate 1140 is a common AND gate in the exemplary embodiment, the present invention is not limited herein. It is understood for persons skilled in the art that the common AND gate may be further implemented by different logic gates. In addition, the phase and/or frequency detector may be a phase detector configured for only detecting the phase, a frequency detector configured for only detecting the frequency, or a phase and frequency detector configured for detecting both of the phase and the frequency.

Figure 12:
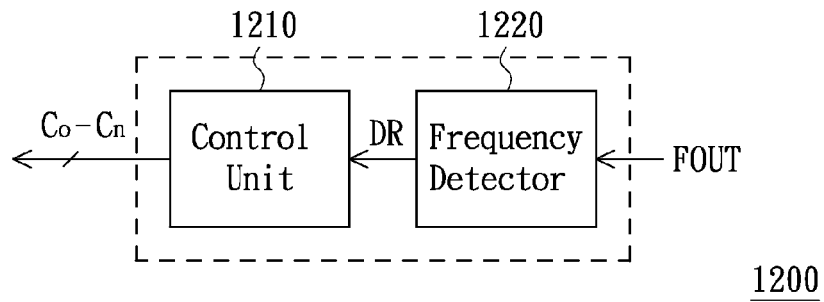
FIG. 12 is a schematic view of a control circuit in accordance with an exemplary embodiment of the present invention.

The following will describe some exemplary embodiments of the control circuit 1150 shown in FIG. 11. FIG. 12 is a schematic view of a control circuit in accordance with an exemplary embodiment of the present invention. As shown in FIG. 12, the control circuit 1200 comprises a control unit 1210 and a frequency detector 1220. The frequency detector 1220 is electrically coupled to an output terminal of the voltage-controlled oscillator of the phase-locked loop, so as to receive the oscillating signal FOUT outputted from the voltage-controlled oscillator for detecting the oscillating frequency of the oscillating signal FOUT and generating a detecting result DR accordingly. In the exemplary embodiment, the frequency detector 1120 may be implemented by a counter. Thus, the present invention may employ the counter to count an enable period of each of the pulses of the oscillating signal FOUT and regard a counting value as the detecting result DR. The control unit 1210 is configured for generating the corresponding delay control signal with the bits of Co-Cn according to the detecting result DR. For example, a look-up table describing the relation between the detecting result related to the oscillating frequency and the delay control signal may be built in the control unit 1210, so that the control unit 1210 can find out the delay control signal with the bits of Co-Cn corresponding to the detecting result DR from the look-up table.

Figure 13:
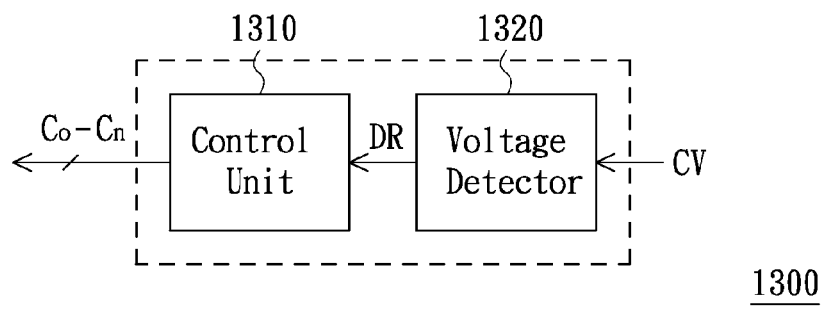
FIG. 13 is a schematic view of a control circuit in accordance with another exemplary embodiment of the present invention.

FIG. 13 is a schematic view of a control circuit in accordance with another exemplary embodiment of the present invention. As shown in FIG. 13, the control circuit 1300 comprises a control unit 1310 and a voltage detector 1320. The voltage detector 1320 is electrically coupled to the output terminal of the voltage-controlled oscillator of the phase-locked loop, so as to detect the frequency control voltage CV received by the voltage-controlled oscillator and generate a detecting result DR accordingly. The control unit 1310 is configured for generating the delay control signal with the bits of Co-Cn according to the detecting result DR. Since the frequency control voltage CV received by the voltage-controlled oscillator is proportional to the oscillating frequency of the oscillating signal outputted from the voltage-controlled oscillator, the present invention may detect the frequency control voltage to obtain the oscillating frequency of the oscillating signal according to the relation between the frequency control voltage CV and the oscillating frequency of the oscillating signal. In addition, a look-up table describing the relation between the detecting result of the frequency control voltage and the delay control signal can be built in the control unit 1310, so that the control unit 1310 can find out the delay control signal with the bits of Co-Cn corresponding to the detecting result DR from the look-up table.

Figure 14:
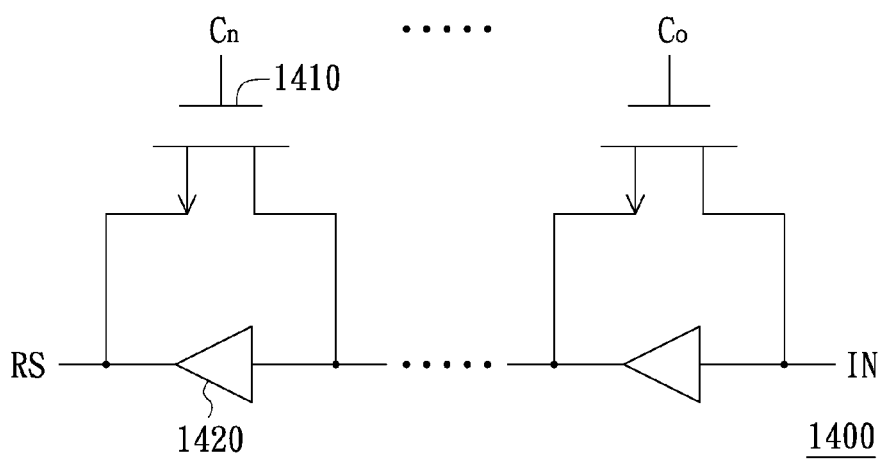
FIG. 14 is a schematic view of a delay circuit in accordance with an exemplary embodiment of the present invention.

The following will describe the delay circuit 1130 shown in FIG. 11 in detail. FIG. 14 is a schematic view of a delay circuit in accordance with an exemplary embodiment of the present invention. As shown in FIG. 14, the delay circuit 1400 comprises a plurality of MOS transistors (as marked by a label of 1410) and a plurality of buffers (as marked by a label of 1420). The buffers 1420 are electrically coupled in series, and the input terminal of each of the buffers 1420 is electrically coupled to the output terminal of a previous-stage one of the buffers 1420. In addition, the input terminal of a first-stage buffer 1420 is configured for receiving the output signal IN of the logic gate, and the output terminal of a last-stage buffer 1420 is configured for outputting the reset signal RS. Generally, the structure of the buffers 1420 electrically coupled in series is called a delay chain. Each of the buffers 1420 may consist of even inverters electrically coupled in series. In addition, each of the MOS transistors 1410 is electrically coupled between the input terminal and the output terminal of a corresponding one of the buffers 1420, and each of the bits of the digital control signal is configured for determining whether to turn on a corresponding one of the MOS transistors 1410. In other words, a gate terminal of each of the MOS transistors 1410 receives a corresponding one of the bits of the digital control signal with the bits of Co-Cn, a source/drain terminal of each of the MOS transistors 1410 is electrically coupled to the input terminal of a corresponding one of the buffers 1420, and another source/drain terminal of each of the MOS transistors 1410 is electrically coupled to the output terminal of the corresponding one of the buffers 1420. It should be noted that although all of the MOS transistors 1410 may be N-type MOS transistors in the exemplary embodiment, the present invention is not limited herein. It is understood for persons skilled in the art that all of the MOS transistors 1410 may also be P-type transistors, as long as the digital control signal with the bits Co-Cn is altered correspondingly.

Figure 15:
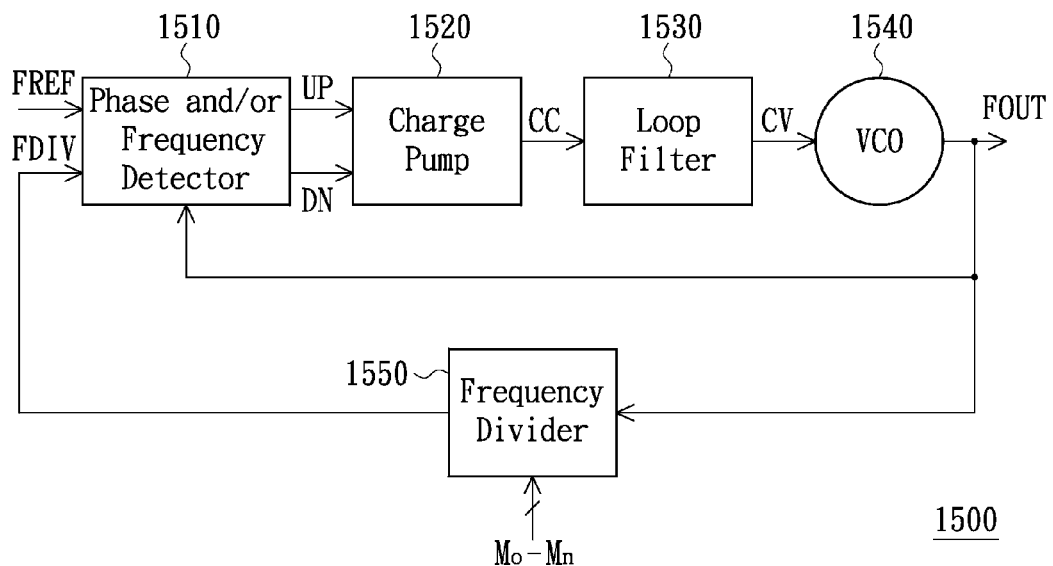
FIG. 15 is a schematic view of a phase-locked loop in accordance with an exemplary embodiment of the present invention.

FIG. 15 is a schematic view of a phase-locked loop in accordance with an exemplary embodiment of the present invention. As shown in FIG. 15, the phase-locked loop 1500 comprises a phase and/or frequency detector 1510, a charge pump 1520, a loop filter 1530, a voltage-controlled oscillator 1540 and a frequency divider 1550. Furthermore, in FIG. 15, a label of FREF represents a reference signal come from the outside of the phase-locked loop, a label of FDIV represents a frequency-divided signal, a label of UP represents a frequency-increasing control signal, a label of DN represents a frequency-reducing control signal, a label of CC represents an output current of the charge pump 1520, a label of CV represents a frequency control voltage, a label of FOUT represents an oscillating signal, and a label of Mo—Mn represent bits of the digital frequency-divided control signal. In the exemplary embodiment, the control circuit of the phase and/or frequency detector 1510 may be implemented by the control circuit as shown in FIG. 12.

Figure 16:
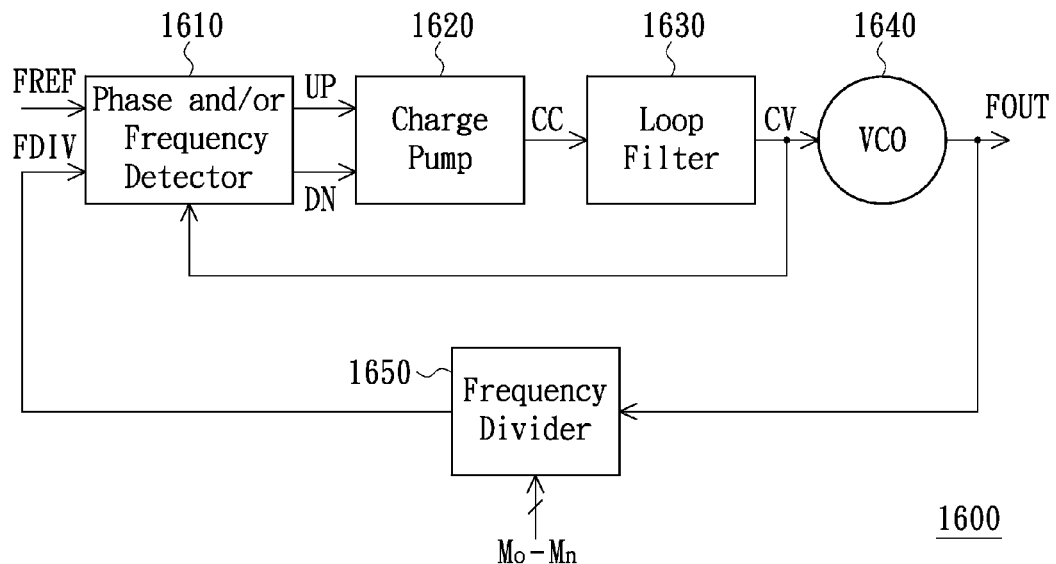
FIG. 16 is a schematic view of a phase-locked loop in accordance with another exemplary embodiment of the present invention.

FIG. 16 is a schematic view of a phase-locked loop in accordance with another exemplary embodiment of the present invention. As shown in FIG. 16, the phase-locked loop 1600 comprises a phase and/or frequency detector 1610, a charge pump 1620, a loop filter 1630, a voltage-controlled oscillator 1640 and a frequency divider 1650. Furthermore, the labels in FIG. 16 which are the same as those in FIG. 15 represent the same signals. In the exemplary embodiment, the control circuit of the phase and/or frequency detector 1610 may be the control circuit as shown in FIG. 13.

Figure 17:
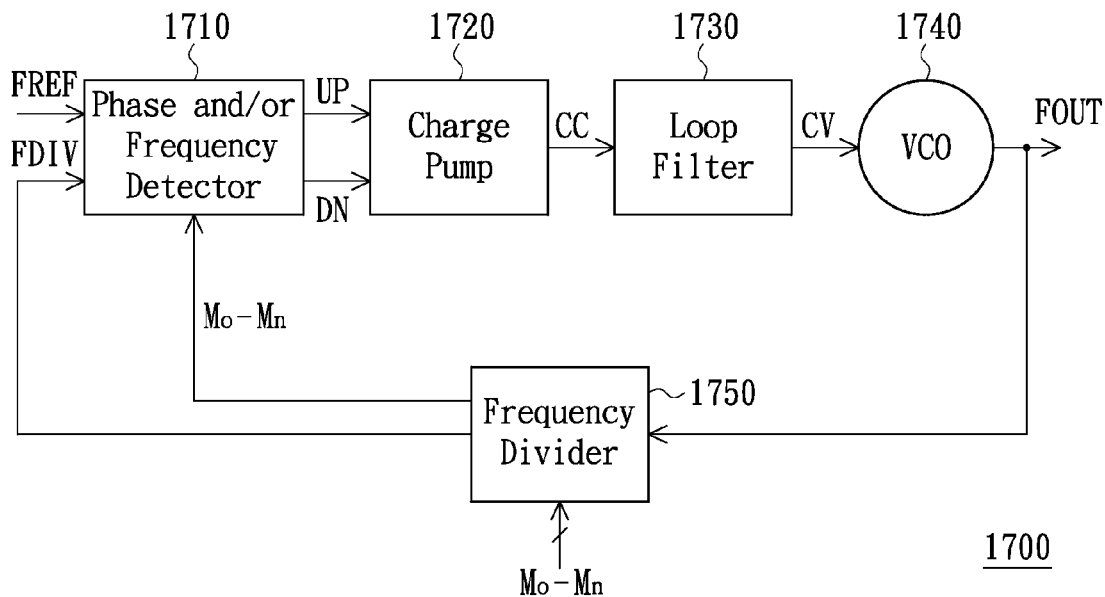
FIG. 17 is a schematic view of a phase-locked loop in accordance with other exemplary embodiment of the present invention.

FIG. 17 is a schematic view of a phase-locked loop in accordance with other exemplary embodiment of the present invention. As shown in FIG. 17, the phase-locked loop 1700 comprises a phase and/or frequency detector 1710, a charge pump 1720, a loop filter 1730, a voltage-controlled oscillator 1740 and a frequency divider 1750. Furthermore, the labels in FIG. 17 which are the same as those in FIG. 15 represent the same signals. In the exemplary embodiment, the frequency divider 1750 transmits the received frequency-divided control signal with the bits of Mo—Mn to the phase and/or frequency detector 1710. The phase and/or frequency detector 1710 may obtain the oscillating frequency of the oscillating signal FOUT according to a frequency-divided multiple corresponding to the frequency-divided control signal with the bits of Mo—Mn and generate a corresponding delay control signal with bits of Co-Cn according to the oscillating frequency of the oscillating signal FOUT. Since the frequency-divided multiple corresponding to the frequency-divided control signal with the bits of Mo—Mn is proportional to the oscillating frequency of the oscillating signal FOUT, the oscillating frequency can be obtained.

Figure 18:
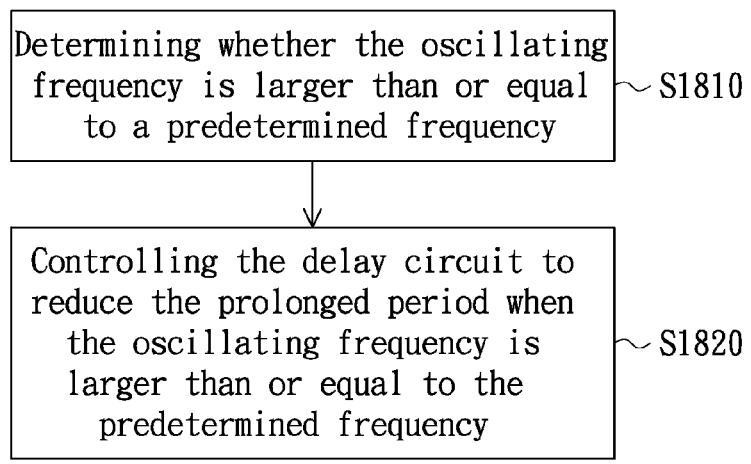
FIG. 18 is a flow chart of an operation method for a phase-locked loop in accordance with an exemplary embodiment of the present invention.

From the above description of the above exemplary embodiments, a substantial operation principle may be concluded for the persons skilled in the art, which is shown in FIG. 18. FIG. 18 is a flow chart of an operation method for a phase-locked loop in accordance with an exemplary embodiment of the present invention. The phase-locked loop comprises a phase and/or frequency detector, and the phase and/or frequency detector comprises a first flip-flop, a second flip-flop, a logic gate and a delay circuit. The first flip-flop has a first data-input terminal, a first data-output terminal, a first clock-input terminal and a first reset terminal. The first data-input terminal is electrically coupled to a power source, and the first clock-input terminal is configured for receiving a reference signal with a reference frequency. The second flip-flop has a second data-input terminal, a second data-output terminal, a second clock-input terminal and a second reset terminal. The second data-input terminal is electrically coupled to the power source, and the second clock-input terminal is configured for receiving a frequency-divided signal which is generated by performing a frequency-divided operation on an oscillating signal with an oscillating frequency outputted from the phase-locked loop. The logic gate is configured for receiving signals outputted from the first data-output terminal and the second data-output terminal. The delay circuit is configured for prolonging a rising period of each of the pulses of a signal outputted from the logic gate to output a reset signal to the first reset terminal and a second reset terminal. Referring to FIG. 18, the operation method comprises the following steps: determining whether the oscillating frequency is larger than or equal to a predetermined frequency (as shown in a step S1810); and controlling the delay circuit to reduce the prolonged period when the oscillating frequency is larger than or equal to the predetermined frequency (as shown in a step S1820).

Furthermore, the operation method further comprises the step: controlling the delay circuit to increase the prolonged period when the oscillating frequency is less than the predetermined frequency.

In summary, the present invention adds the delay circuit and the control circuit into the phase and/or frequency detector. Thus, the present invention can employ the delay circuit to prolong the rising period of each of the pulses of the signal outputted from the logic gate, so as to further prolong the rising period of each of the pulses of the frequency-increasing control signal (i.e., the signal outputted from the first flip-flop) and the rising period of each of the pulses of the frequency-reducing control signal (i.e., the signal outputted from the second flip-flop) outputted from the phase and/or frequency detector. Therefore, the problem of the dead zone of the conventional phase-locked loop can be solved, and the jittering problem of the output signal of the phase-locked loop can also be solved. In addition, the present invention can further employ the control circuit to determine whether the oscillating frequency outputted from the phase-locked loop is larger than or equal to a predetermined frequency and to dynamically control the power consumption of the phase-locked loop. When the oscillating frequency is larger than or equal to the predetermined frequency, the control circuit controls the delay circuit to reduce the prolonged period for reducing the power consumption of the phase-locked loop operating in high frequency. When the oscillating frequency is less than the predetermined frequency, the control circuit controls the delay circuit to increase the prolonged period.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A phase and/or frequency detector, comprising:
a first flip-flop having a first data-input terminal, a first data-output terminal, a first clock-input terminal and a first reset terminal, the first data-input terminal being electrically coupled to a power source, and the first clock-input terminal being configured for receiving a reference signal with a reference frequency;
a second flip-flop having a second data-input terminal, a second data-output terminal, a second clock-input terminal and a second reset terminal, the second data-input terminal being electrically coupled to the power source, the second clock-input terminal being configured for receiving a frequency-divided signal, and the frequency-divided signal being generated by performing a frequency-divided operation on an oscillating signal with an oscillating frequency;

a logic gate configured for receiving signals outputted from the first data-output terminal and the second data-output terminal;

a control circuit configured for generating a delay control signal according to the oscillating frequency of the oscillating signal; and a delay circuit configured for altering a prolonged period according to the delay control signal to generate a reset signal to be outputted to the first reset terminal and the second reset terminal.

2. The phase and/or frequency detector according to claim 1, wherein the delay control signal controls the delay circuit to increase the prolonged period when the oscillating frequency is less than a predetermined frequency, and the delay control signal controls the delay circuit to reduce the prolonged period when the oscillating frequency is larger than or equal to the predetermined frequency.

3. The phase and/or frequency detector according to claim 1, wherein the control circuit comprises:

a frequency detector configured for receiving the oscillating signal and detecting the oscillating frequency of the oscillating signal, so as to generate a detecting result accordingly; and a control unit configured for generating the corresponding delay control signal according to the detecting result.

4. The phase and/or frequency detector according to claim 3, wherein the frequency detector comprises:

a counter configured for counting an enable period of each of the pulses of the oscillating signal and regarding a counting value as the detecting result.

5. The phase and/or frequency detector according to claim 1, wherein the control circuit comprises:

a voltage detector configured for detecting the voltage value of a frequency control voltage received by a voltage-controlled oscillator and generating a detecting result accordingly, the voltage-controlled oscillator being configured for generating the oscillating signal; and a control unit configured for generating the corresponding delay control signal according to the detecting result.

6. The phase and/or frequency detector according to claim 1, wherein the delay control signal is a digital control signal with a plurality of bits, and the delay circuit comprises:

a plurality of buffers electrically coupled in series; and a plurality of MOS transistors, wherein each of the MOS transistors is electrically coupled between an input terminal and an output terminal of a corresponding one of the buffers, and each of the bits of the digital control signal is configured for determining whether a corresponding one of the MOS transistors is turned on.

7. A phase lock loop, comprising:

a phase and/or frequency detector, comprising:

a first flip-flop having a first data-input terminal, a first data-output terminal, a first clock-input terminal and a first reset terminal, the first data-input terminal being electrically coupled to a power source, and the first clock-input terminal being configured for receiving a reference signal with a reference frequency;

a second flip-flop having a second data-input terminal, a second data-output terminal, a second clock-input terminal and a second reset terminal, the second data-input terminal being electrically coupled to the power source, the second clock-input terminal being configured for receiving a frequency-divided signal, and the frequency-divided signal being generated by performing a frequency-divided operation on an oscillating signal with an oscillating frequency;

a logic gate configured for receiving signals outputted from the first data-output terminal and the second data-output terminal;

a control circuit configured for generating a delay control signal according to the oscillating frequency of the oscillating signal; and a delay circuit configured for altering a prolonged period according to the delay control signal to generate a reset signal to be outputted to the first reset terminal and the second reset terminal;

a charge pump configured for generating an output current according to the signals outputted from the first data-output terminal and the second data-output terminal;

a loop filter configured for generating a frequency control voltage according to the output current;

a voltage-controlled oscillator configured for generating the oscillating signal and determining the oscillating frequency of the oscillating signal according to the frequency control voltage; and a frequency divider configured for performing the frequency-divided operation on the oscillating signal accordingly to a frequency-divided multiple corresponding to a frequency-divided control signal, so as to generate the frequency-divided signal.

8. The phase-locked loop according to claim 7, wherein the delay control signal controls the delay circuit to increase the prolonged period when the oscillating frequency is less than a predetermined frequency, and the delay control signal controls the delay circuit to reduce the prolonged period when the oscillating frequency is larger than or equal to the predetermined frequency.

9. The phase-locked loop according to claim 7, wherein the control circuit comprises:

a frequency detector configured for receiving the oscillating signal and detecting the oscillating frequency of the oscillating signal, so as to generate a detecting result accordingly; and a control unit configured for generating the corresponding delay control signal according to the detecting result.

10. The phase-locked loop according to claim 9, wherein the frequency detector comprises:

a counter configured for counting an enable period of each of the pulses of the oscillating signal and regarding a counting value as the detecting result.

11. The phase-locked loop according to claim 7, wherein the control circuit comprises:

a voltage detector configured for detecting the voltage value of the frequency control voltage and generating a detecting result accordingly; and a control unit configured for generating the corresponding delay control signal according to the detecting result.

12. The phase-locked loop according to claim 7, wherein the delay control signal is a digital control signal with a plurality of bits, and the delay circuit comprises:

a plurality of buffers electrically coupled in series; and a plurality of MOS transistors, wherein each of the MOS transistors is electrically coupled between an input terminal and an output terminal of a corresponding one of the buffers, and each of the bits of the digital control signal is configured for determining whether a corresponding one of the MOS transistors is turned on.

13. An operation method for a phase-locked loop, the phase-locked loop comprising a phase and/or frequency detector, the phase and/or frequency detector comprising a first flip-flop, a second flip-flop, a logic gate and a delay circuit, the first flip-flop having a first data-input terminal, a first data-output terminal, a first clock-input terminal and a first reset terminal, the first data-input terminal being electrically coupled to a power source, the first clock-input terminal being configured for receiving a reference signal with a reference frequency, the second flip-flop having a second data-input terminal, a second data-output terminal, a second clock-input terminal and a second reset terminal, the second data-input terminal being electrically coupled to the power source, the second clock-input terminal being configured for receiving a frequency-divided signal, the frequency-divided signal being generated by performing a frequency-divided operation on an oscillating signal with an oscillating frequency outputted from the phase-locked loop, the logic gate being configured for receiving signals outputted from the first data-output terminal and the second data-output terminal, the delay circuit being configured for prolonging a rising period of each of the pulses of a signal outputted from the logic gate, so as to generate a reset signal to be outputted to the first reset terminal and the second reset terminal, the operation method comprising:

determining whether the oscillating frequency is larger than or equal to a predetermined frequency; and controlling the delay circuit to reduce the prolonged period when the oscillating frequency is larger than or equal to the predetermined frequency.

14. The operation method according to claim 13, further comprising:

controlling the delay circuit to increase the prolonged period when the oscillating frequency is less than the predetermined frequency.

\* \* \* \* \*